(12) United States Patent
McKittrick et al.

(10) Patent No.: US 11,435,235 B2
(45) Date of Patent: Sep. 6, 2022

(54) INFORMATION HANDLING SYSTEM DYNAMIC FOOT FOR ADAPTIVE THERMAL MANAGEMENT

(71) Applicant: Dell Products L.P., Round Rock, TX (US)

(72) Inventors: Allen B. McKittrick, Cedar Park, TX (US); Pomin Shih, Beitou District (TW); Timothy C. Shaw, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 175 days.

(21) Appl. No.: 16/844,143

(22) Filed: Apr. 9, 2020

(65) Prior Publication Data

US 2021/0318174 A1    Oct. 14, 2021

(51) Int. Cl.
| | |
|---|---|
| *G01K 1/00* | (2006.01) |
| *G05B 15/02* | (2006.01) |
| *F16M 11/10* | (2006.01) |
| *F16M 13/00* | (2006.01) |
| *H05K 5/02* | (2006.01) |

(52) U.S. Cl.
CPC .............. *G01K 1/00* (2013.01); *F16M 11/10* (2013.01); *F16M 13/00* (2013.01); *G05B 15/02* (2013.01); *H05K 5/0234* (2013.01); *F16M 2200/08* (2013.01)

(58) Field of Classification Search
CPC .......... G01K 1/00; F16M 11/10; F16M 13/00; F16M 2200/08; G05B 15/02; H05K 5/0234; G06F 1/1681; G06F 1/166; G06F 1/206; G06F 1/203

USPC ....................... 248/688, 615, 677, 673, 188.8
See application file for complete search history.

(56) References Cited

U.S. PATENT DOCUMENTS

| | | | | |
|---|---|---|---|---|
| 5,388,792 | A  * | 2/1995 | Hastings ................ | F16M 11/22 248/188.8 |
| 6,311,941 | B1 * | 11/2001 | Feldmeyer ............. | A47B 97/00 312/351.9 |
| 7,252,350 | B2 * | 8/2007 | Chen ..................... | A47B 91/005 312/351.3 |
| 7,765,438 | B2 | 7/2010 | Haugh | |
| 9,010,623 | B2 | 4/2015 | Arnouse | |
| 10,007,308 | B2 | 6/2018 | Mongia et al. | |
| 2010/0002379 | A1 * | 1/2010 | Hadad ................... | G06F 1/1616 361/679.59 |
| 2011/0069447 | A1 * | 3/2011 | Trang ..................... | G06F 1/203 361/679.55 |

(Continued)

*Primary Examiner* — Muhammad Ijaz
(74) *Attorney, Agent, or Firm* — Zagorin Cave LLP; Robert W. Holland

(57) ABSTRACT

A portable information handling system has dynamic foot disposed at a bottom surface of a housing that extends and retracts to adjust cooling airflow impedance at vents disposed at the bottom surface. The dynamic foot includes an actuator in an internal cavity having opposing ramp structures interfaced by a nickel titanium wire that changes phase when heated to move the ramp structures. In the example embodiment, a push-push lock engages and disengages the ramp structures at each activation of the nickel titanium wire so that an embedded controller controls foot extension and retraction by applying current to the nickel titanium wire that heats the wire based upon detection of predetermined thermal conditions in the housing.

20 Claims, 5 Drawing Sheets

(56) References Cited

U.S. PATENT DOCUMENTS

| | | | | |
|---|---|---|---|---|
| 2013/0075550 | A1* | 3/2013 | Chiu | G06F 1/1656 248/188.9 |
| 2019/0297739 | A1* | 9/2019 | Krips | G06F 1/1656 |
| 2020/0301486 | A1* | 9/2020 | Zhang | G06F 1/203 |
| 2020/0319670 | A1* | 10/2020 | Elsey | G06F 1/1681 |
| 2021/0318174 | A1* | 10/2021 | McKittrick | G06F 1/203 |

\* cited by examiner

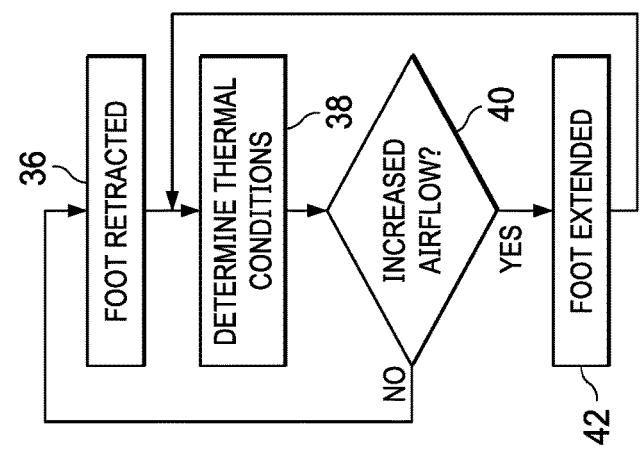
FIG. 2
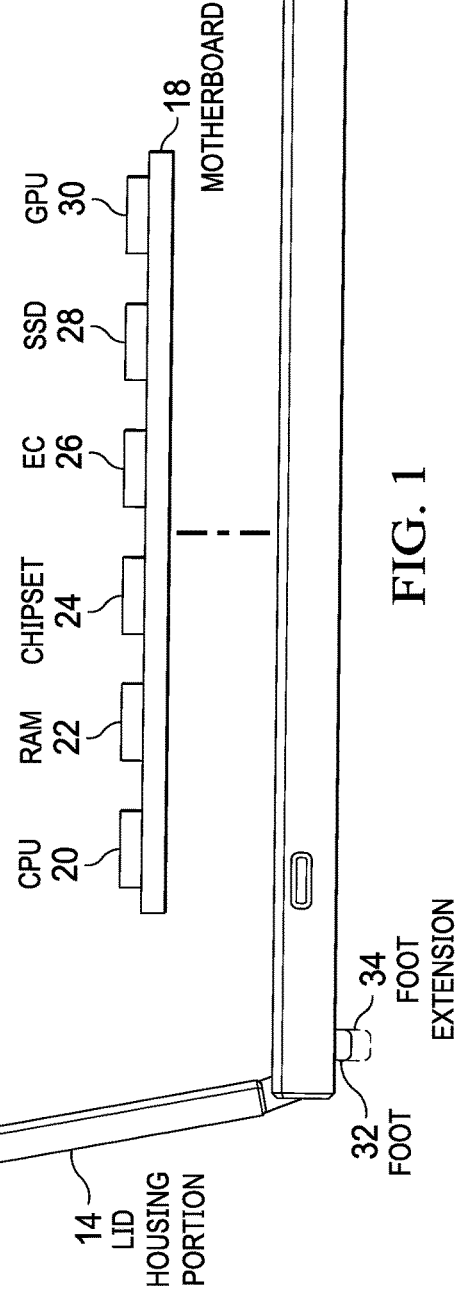
FIG. 1

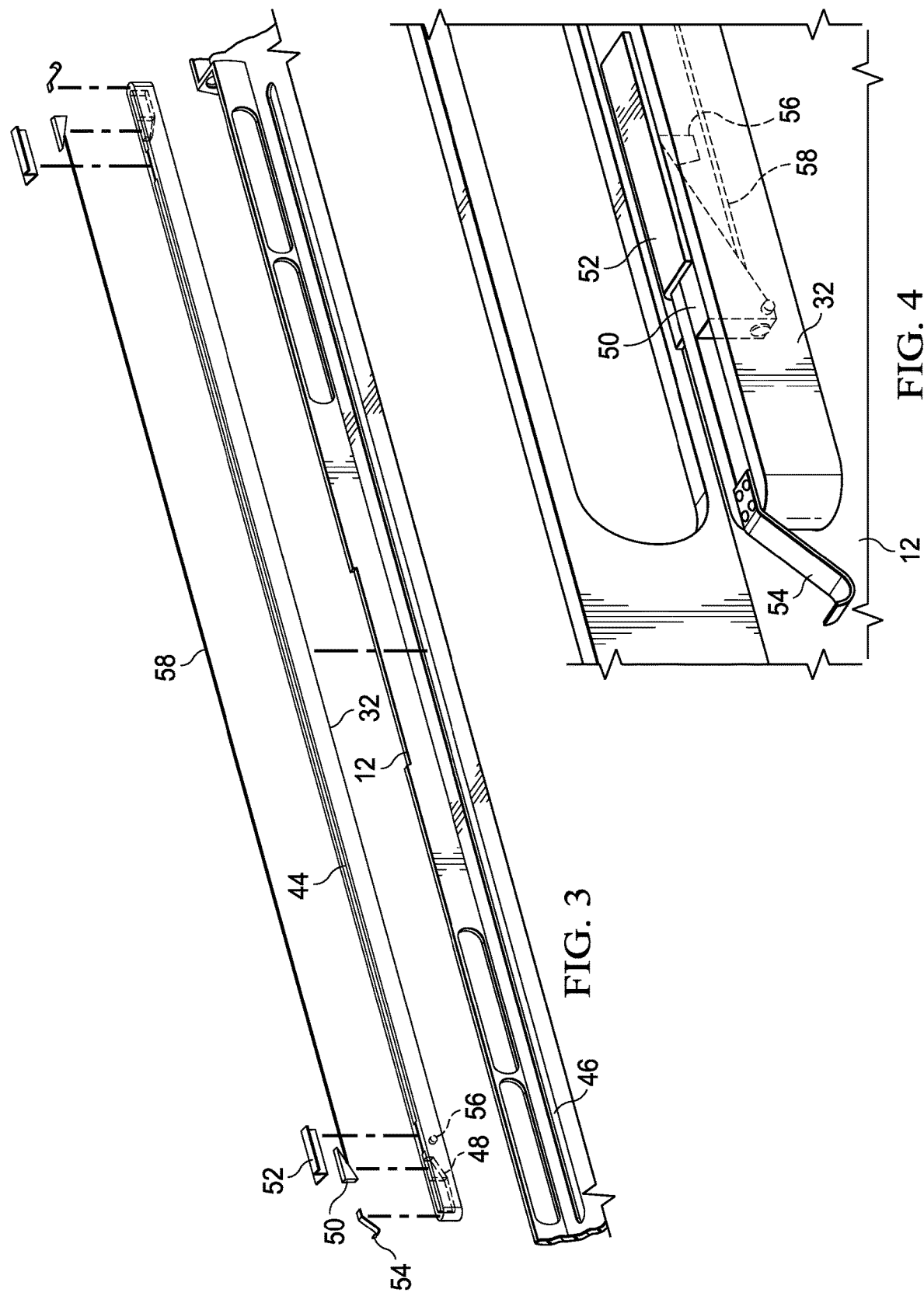

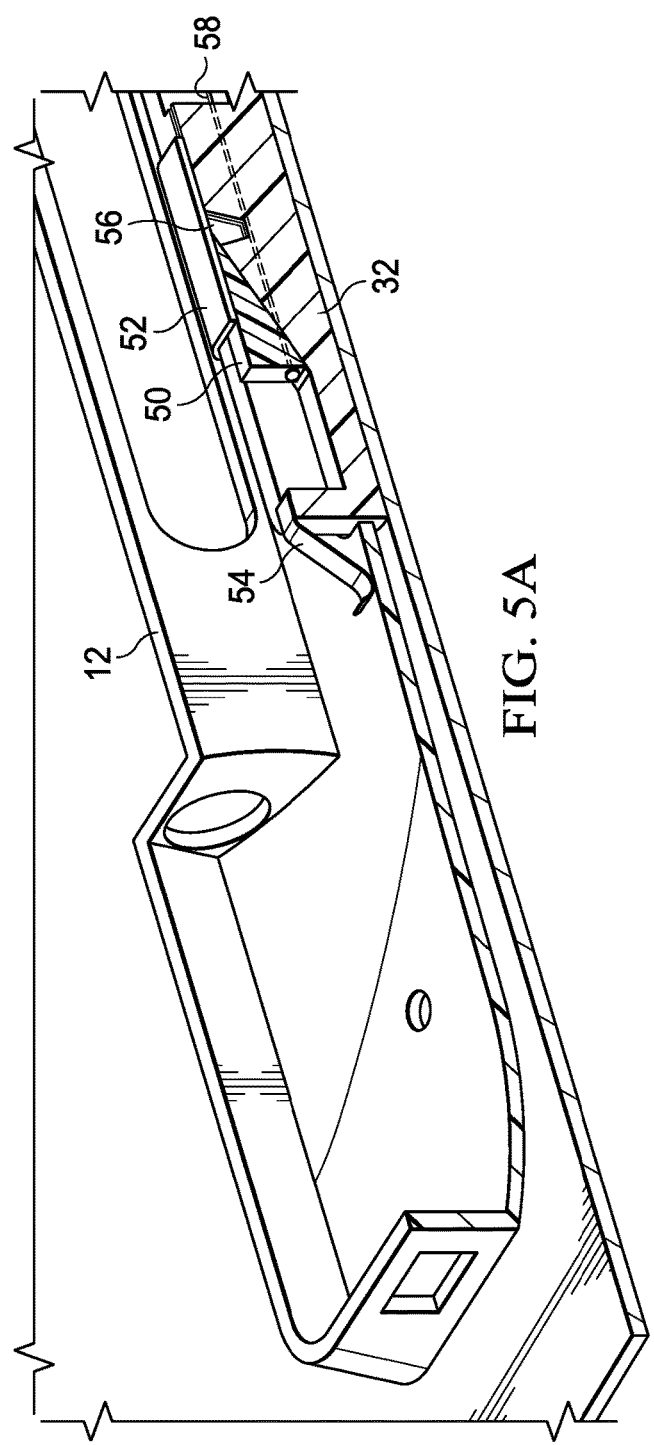
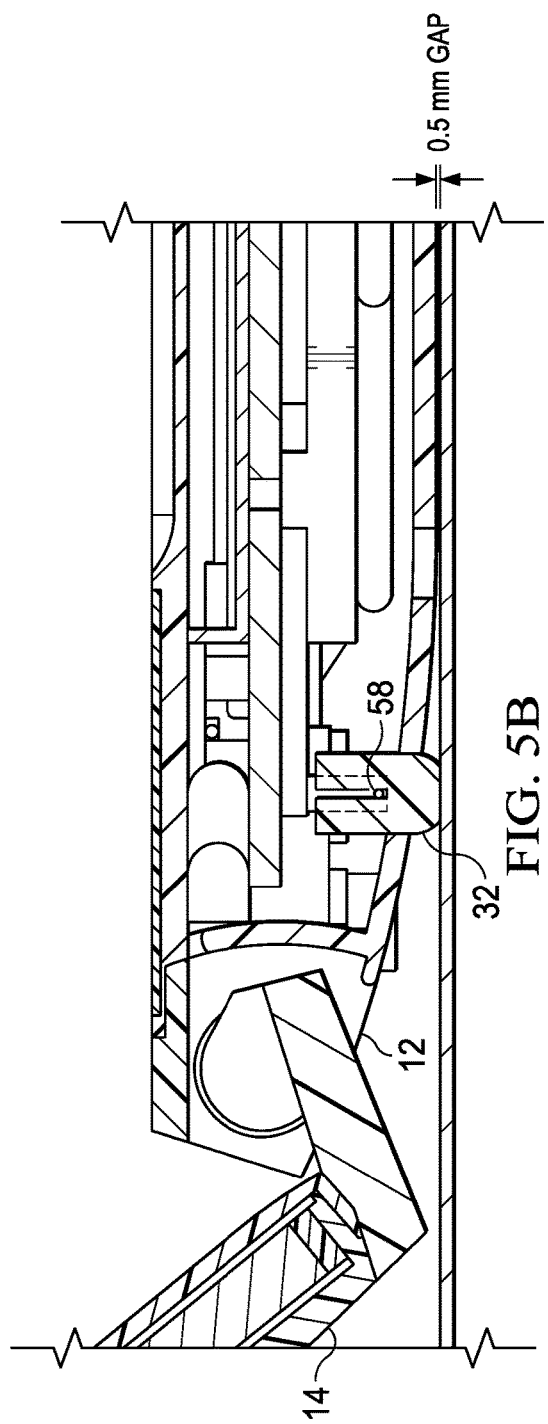

INFORMATION HANDLING SYSTEM DYNAMIC FOOT FOR ADAPTIVE THERMAL MANAGEMENT

BACKGROUND OF THE INVENTION

Field of the Invention

The present invention relates in general to the field of portable information handling systems, and more particularly to information handling system dynamic foot for adaptive thermal management.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Generally end users prefer to have portable housings of minimal thickness and weight to provide improved portability. Although a small profile housing can include powerful processing components, typically the ability to fully use such processing components is limited by the thermal energy generated as a byproduct of power dissipation by the processing components. For example, small profile housings have less interior room in which thermal transfer to ambient air can take place. In portable information handling systems having active thermal management, such as a cooling fan that intakes external air past the processing components and out an exhaust, low profile housings tend to have high impedance to airflow that reduces thermal transfer efficiency. If thermal transfer is insufficient, processing components often have to throttle their operating parameters to reduce power dissipation and related thermal release.

Typically, portable information handling systems intake a cooling airflow through vents located at the bottom of the housing and exhaust the airflow out an exhaust located at the rear side of the housing. One difficulty with this approach is that airflow under the housing tends to be restricted when the housing rests on a support surface, such as a desktop. To help improve airflow, the bottom side of the housing typically includes feet that extend downward to separate the intake vents from the support surface. Although greater foot height tends to result in improved cooling airflow impedance with resulting improved cooling, feet extending from the housing tend to detract from the system appearance and add to the system height, or at least to the end user perception of greater system height.

SUMMARY OF THE INVENTION

Therefore, a need has arisen for a system and method which adjusts information handling system housing height over a support surface for adaptive thermal management at the information handling system.

In accordance with the present invention, a system and method are provided which substantially reduce the disadvantages and problems associated with previous methods and systems for adaptively managing information handling system thermal operating conditions. A dynamic foot integrates an actuator in a cavity that selectively extends and retracts to vary the height of an information handling system housing over a support surface. Extending the foot during times of thermal stress reduces airflow impedance at housing bottom surface vents to improve system cooling.

More specifically, an information handling system processes information with processing components disposed in a housing, such as a processor and memory. The processing components generate thermal energy by dissipating power and rejects the thermal energy to an external environment in part with vents located at a bottom housing surface. During predetermined thermal conditions, an embedded controller commands a dynamic foot to extend from the housing bottom surface to increase the gap between the housing bottom surface and a support surface. The dynamic foot integrates an actuator in a cavity that actuates to extend and retract the dynamic foot in response to a command received from a controller. In the example embodiment, the actuator comprises first and second ramps formed in a bottom surface at opposing ends of the cavity and aligns first and second sliding ramps at the first and second ramps with a nickel titanium wire coupled between the first and second sliding ramps. Upon application of a current to heat the nickel titanium wire, the sliding ramps are pulled towards each other so that the first and second sliding ramps interact with the first and second ramps to induce vertical movement of the dynamic foot. The vertical movement is translated relative to the housing by a sliding bracket coupled between the housing and the sliding ramps. A lock engages the sliding ramp to the foot at a desired position after activation of the nickel titanium wire. A biasing device, such as leaf spring biases the foot into the housing once the lock is released. In one embodiment, the lock is a push-push mechanism that engages and releases on each actuation of the nickel titanium wire.

The present invention provides a number of important technical advantages. One example of an important technical advantage is that an information handling system adapts a foot height relative to a housing bottom surface to adjust airflow impedance for cooling air based upon thermal conditions. The dynamic foot actuator fits within a cavity of the foot for ease of assembly and reduced cost. In one example embodiment, when a dynamic foot raises the housing bottom surface from 1.0 mm above a support surface to 3.0 mm above the support surface, operating airflow increases by 34% from 2.3 CFM to 31 .CFM. The additional airflow and a constant operating state reduces system skin temperature by 6 degrees Celsius. Improved thermal rejection allows the information handling system to operate at a higher power consumption without exceeding processing component thermal constraints. Retracting the dynamic foot into the housing reduces system height to provide the end user with an improved experience.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 1 depicts an exploded view of a portable information handling system having a dynamic foot to adapt to thermal conditions;

FIG. 2 depicts a flow diagram of a process for adapting a dynamic foot position with an embedded controller based upon thermal conditions;

FIG. 3 depicts an exploded view of a dynamic foot that extends and retracts at an information handling system housing bottom surface;

FIG. 4 depicts a cutaway view of a dynamic foot biased by a leaf spring into the information handling system housing;

FIGS. 5A and 5B depict a cutaway view of the dynamic foot in a retracted position;

DETAILED DESCRIPTION

Figure 6A:
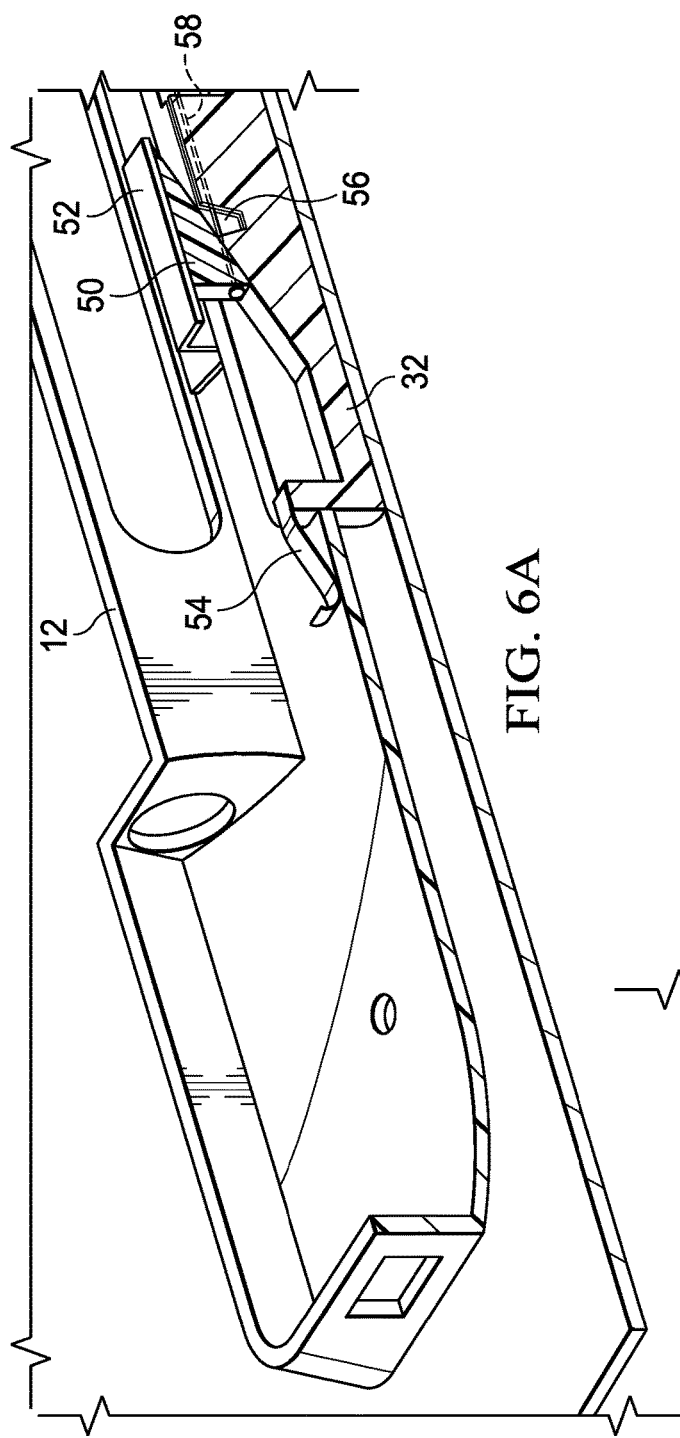
FIGS. 6A and 6B depict a cutaway view of the dynamic foot in a partially extended positon.

An information handling system dynamic foot at a housing bottom surface selectively extends and retracts to adapt airflow impedance to system thermal conditions. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Referring now to FIG. 1, an exploded view depicts a portable information handling system 10 having a dynamic foot 32 to adapt to thermal conditions. In the example embodiment, information handling system 10 has a portable housing with a main housing portion 12 that rests on a support surface and a lid housing portion 14 rotationally coupled to main housing portion 12 by a hinge. A display 16 integrates in lid housing portion 14 to present information as visual images in a raised position over main housing portion 12. In the clamshell open position depicted by FIG. 1, main housing portion 10 provides a base that holds lid housing portion 14 so that display 16 is aligned for viewing while an end user interacts with an input device, such as a keyboard and/or touchpad integrated on the upper surface of main housing portion 12. Main housing portion 12 integrates processing components that cooperate to process information. For instance, a motherboard 18 interfaces processing components that communicate to process information, such as a central processing unit (CPU) 20 that executes instructions and a random access memory (RAM) 22 that stores the instructions and information. A chipset 24 interfaces with CPU 20 to manage clock speed, memory accesses and other processing functions. An embedded controller 26 manages component operations on a physical level, such as power application and thermal conditions. A solid state drive (SSD) 28 provides persistent storage of information in flash memory, such as an operating system and applications that are retrieved for execution at CPU 20 at power application by embedded controller 26. A graphics processor unit (GPU) 30 processes graphics information to define pixel colors for presentation of visual images at display 16.

Generally, the processing components operate by dissipating direct current power through an integrated circuit and, in the process, releasing thermal energy within main housing portion 12. Unless the thermal energy is rejected external to main housing portion 12, temperatures can exceed the operating constraints of the processing components, resulting in throttling of clock speeds and other steps that impact system performance. Some portable information handling systems rely upon passive cooling through vents, such as at the back and bottom surfaces of main housing 12. Others employ active cooling, such as by a cooling fan, that force air through main housing 12. In either case, airflow impedance varies based upon the height of the bottom surface of main housing 12 over the support surface on which it rests. To aid in thermal transfer, a foot 32 extends out of main housing 12 to raise the bottom surface away from the support surface so that air flows though main housing 12 with a lower impedance. Foot 32 provides a dynamic vertical movement relative to main housing 12, as illustrated by foot extension outline 34, so that additional space is provided between the supporting surface and vents on the main housing 12 bottom to allow improved airflow when thermal conditions in information handling system 10 call for additional cooling.

Referring now to FIG. 2, a flow diagram depicts a process for adapting a dynamic foot position with an embedded controller based upon thermal conditions. For instance, the process executes as embedded code on an embedded controller that is stored in non-transient memory of the embedded controller. The process starts at step 36 with the dynamic foot in a retracted position, such as when the information handling system is powered off. At step 38, a determination is made of the thermal conditions at the information handling system. The thermal conditions may include temperatures measured inside the housing, temperatures measured for cooling airflow intake and exhaust, temperatures measured at processing components like the CPU, and projections of changes to the measured temperatures based upon system workload. At step 40, a determination is made based upon the thermal conditions of whether an increased airflow is desired by decreasing airflow impedance with a dynamic foot extension. If an increased airflow is not determined, the process continues to step 36 to retract to dynamic foot if extended. If an increased airflow is determined, the process continues to step 42 to extend the dynamic foot. At the extension of the dynamic foot, the process returns to step 38 to continue monitoring thermal conditions at the information handling system.

Referring now to FIG. 3, an exploded view depicts a dynamic foot 32 that extends and retracts at an information handling system housing 12 bottom surface. In the example embodiment, dynamic foot 32 extends and retracts at an opening 46 of main housing 12 with an actuator integrated in a cavity 44 formed at dynamic foot 32 within the interior of main housing 12. The actuator causes vertical motion of dynamic foot by translating horizontal motion initiated by heating of a nickel titanium wire 58 through interactions between opposing ramps 48 integrated in cavity 44 and a sliding ramp 50 coupled to main housing 12 by a slider bracket 52. In the example embodiment, current is applied to nickel titanium wire 58 to heat the wire and induce a phase change between austenite and martenite crystalline states, thus shortening the wire length. When the nickel titanium wire shortens, sliding ramps 50 are pulled towards each other and up ramps 48 formed in cavity 44. The upward motion of sliding ramps 50 is translated with a slider bracket 52 to main housing 12 resulting in vertical motion of dynamic foot 32 out of opening 46. A lock 56 engages sliding ramp 50 at the shortened wire length to hold the vertical position as current is removed from nickel titanium wire 58 and the wire lengthens in response to a lower temperature crystalline phase change. A leaf spring 54 couples to foot 32 and biases against main housing 12 to bias foot 32 towards a retracted position in main housing 12 so that, upon release of lock 56, foot 32 automatically retracts into main housing 12. In the example embodiment, lock 56 is a push-push mechanism that extends into an opening of each sliding ramp as nickel titanium wire 58 shortens and holds in place as nickel titanium wire 58 cools and lengthens so that leaf springs 54 biases foot 32 out of main housing 12 to hold lock 56 engaged. To release lock 56, current is applied to nickel titanium wire 58 to shorten the wire and work against lock 56 pushing lock 56 to a disengaged position at which it remains while nickel titanium wire 58 cools to allow leaf spring 54 to bias foot 32 into main housing 12.

In a variety of alternative embodiments, foot 32 may retract and extend with various arrangements of the actuator. For example, sliding ramps 50 may integrate on a rail formed in the bottom surface of cavity 44 to work against stationary ramps 48 integrated with main housing 12. As another example, all ramps disposed in foot 32 may have a common orientation so that nickel titanium wire 58 pulls the ramps in a common direction rather than in a movement towards each other. In another alternative embodiment, vertical movement may be provided with a single set of opposing stationary and sliding ramps at a central location of foot 32, or a single set of opposing ramps that each move in response to a separate nickel titanium wire. In addition, other types of locks 56 may be used to hold foot 32 in an extended position as well as other positions for the locks. For instance, a single lock 56 might engage foot 32 at a central position. Various other arrangements of the actuator may be used to enhance manufacture simplicity and cost. In other alternative embodiments, other types of actuators may be used in the foot cavity, such as a solenoid.

Referring now to FIG. 4, a cutaway view depicts a dynamic foot 32 biased by a leaf spring 54 into the information handling system housing 12. In the example embodiment, leaf spring 54 couples to foot 32 and extends over main housing 12 so that foot 32 is biased upward and into main housing 12. Slider bracket 52 engages in a rail formed in main housing 12 to slide with a fixed horizontal position relative to main housing 12 so that vertical movement is imparted to foot 32 as sliding ramp 50 moves relative to ramp 48. In the example embodiment, lock 56 is integrated in ramp 48 to move with a push-push action into an opening formed in sliding ramp 50. As an example, the opening has a bevel formed on one side so that movement of sliding ramp 50 by nickel titanium wire shortening pushes lock 56 out of the opening and activates the push-push mechanism. This arrangement allows the same activation of the nickel titanium wire to both lock and unlock the vertical position of foot 32. In one example embodiment, an application programming interface or other user interface provides an operating system of the information handling system with access to a command that applies current with the embedded controller to raise and lower foot 32 in response to an end user selection.

Referring now to FIGS. 5A and 5B, a cutaway view depicts the dynamic foot 32 in a retracted position. FIG. 5A depicts that leaf spring 54 biases against main housing 12 to retract foot 32 into main housing 12 when foot 32 is not locked in a down position. FIG. 5B depicts the retracted position for foot 32 with information handling system 10 in an open position and resting on a support surface. In the example embodiment, with foot 32 in a fully retracted position, a base portion of foot 32 extends out from the bottom of main housing portion 12 to hold information handling system 10 above the support surface with a 0.5 mm gap. The relatively small gap of the example embodiment provides increased airflow impedance that is, nonetheless, sufficient for a cooling airflow in a low workload and otherwise more modest thermal environment.

Figure 6B:
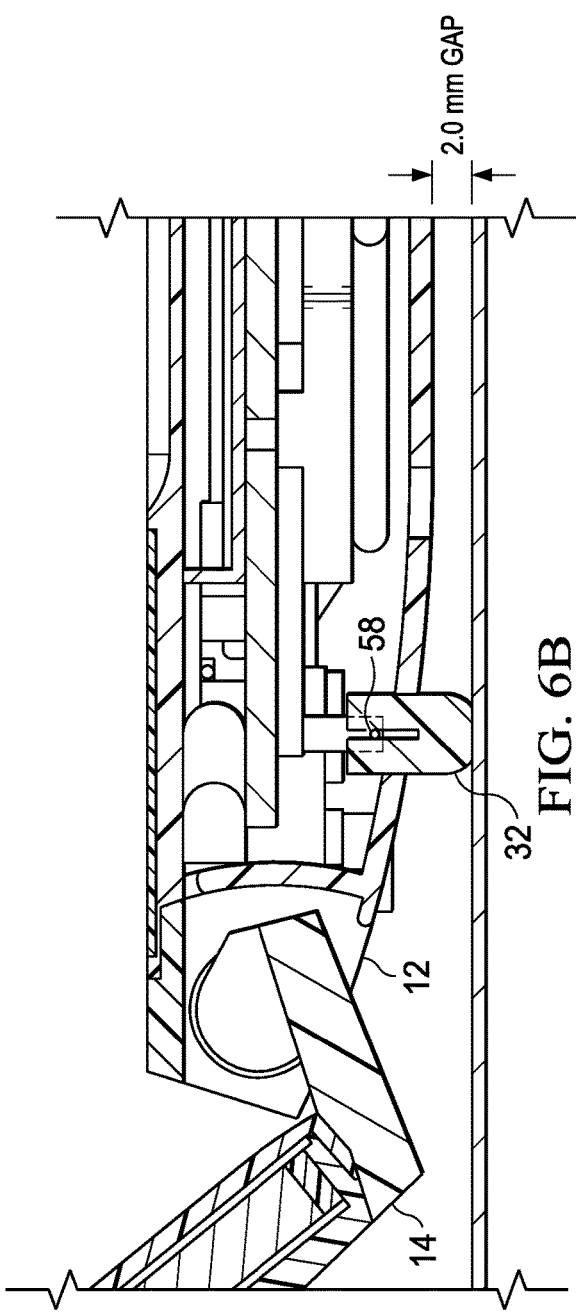

Referring now to FIGS. 6A and 6B, a cutaway view depicts the dynamic foot 32 in a partially extended positon. A partial extension may be accomplished by locating multiple locks at multiple positions of foot 32 or using a single lock with multiple locking locations, such as multiple openings in which a single lock can insert. In the example embodiment, partial extension of foot 32 provides a 2.0 mm gap of the bottom surface of information handling system 10 above the support surface. The larger gap improves airflow for cooling of the processing components by reducing the impedance of the cooling airflow into main housing 12.

Figure 7A:
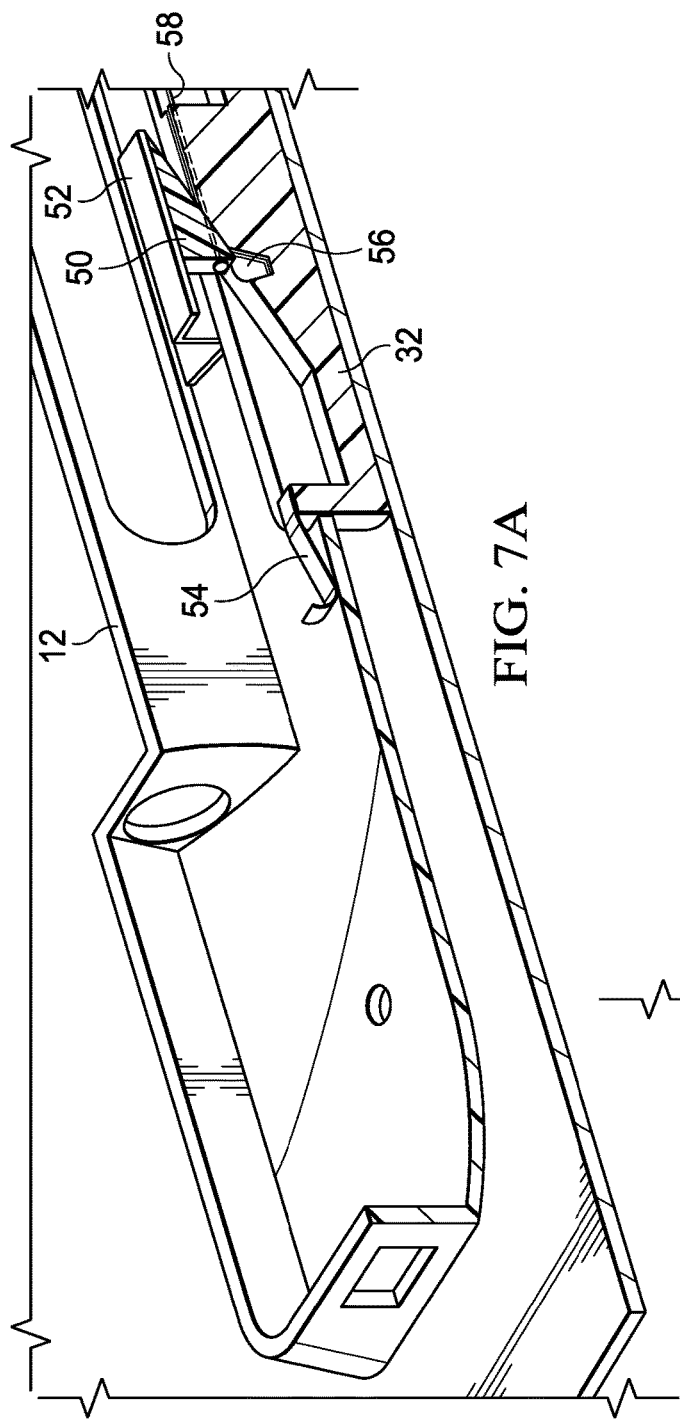
FIGS. 7A and 7B depict a cutaway view of the dynamic foot in a fully extended position.
Figure 7B:
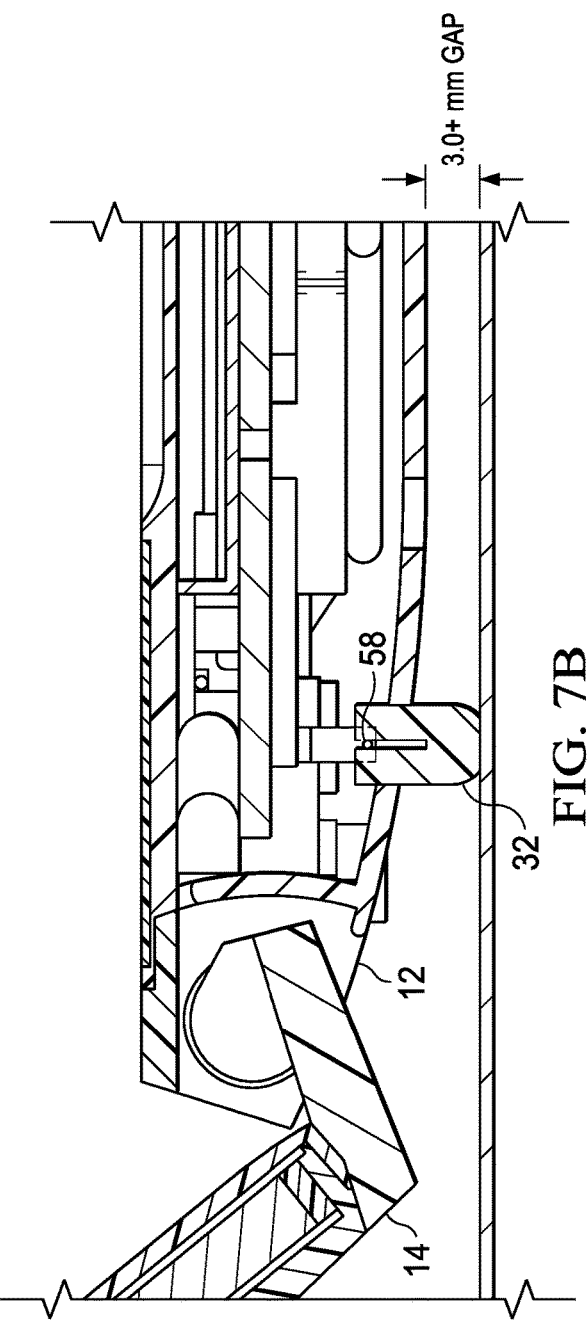

Referring now to FIGS. 7A and 7B, a cutaway view depicts the dynamic foot 32 in a fully extended position. In the example embodiment, full extension of dynamic foot 32 provides a 3.0 mm gap between main housing 12 bottom surface and the support surface. In various embodiments, various heights may be used. Further, although the example embodiment depicts a single dynamic foot 32 located at the rear side of the main housing portion 12 proximate the hinge coupling the lid housing portion, in alternative embodiments, multiple dynamic feet 32 may be used, such as a foot in the depicted rear position and another foot in a forward position. In various embodiments, the dynamic foot may include a dampener or biasing device to moderate foot movement response and reduce perception of movement by an end user.

Although the present invention has been described in detail, it should be understood that various changes, substitutions and alterations can be made hereto without departing from the spirit and scope of the invention as defined by the appended claims.

What is claimed is:
1. An information handling system comprising:
a housing having a lower surface and a foot opening;

processing components disposed in the housing and operable to process information;
a foot extending through the opening the foot having a cavity; and
an actuator system disposed in the cavity and interfaced with the processing components, the actuator having first and second ramp structures formed in the cavity, first and second sliding ramps disposed in the cavity proximate the first and second ramp structures, a first slider bracket coupled to the first sliding ramp and slidingly coupled to the housing, a second slider bracket coupled to the second sliding ramp and slidingly coupled to the housing, and an actuator interfaced with the first and second sliding ramps, the actuator moving the first and second sliding ramps towards each other to engage the first and second ramp structures and extend the foot out of the housing.

2. The information handling system of claim 1 further comprising:
a biasing device coupled to the housing and the foot to bias the foot into the housing; and
a lock coupled to the housing to selectively engage the first and second sliding ramps when the foot extends out of the housing.

3. The information handling system of claim 2 wherein:
the actuator comprises a nickel titanium wire; and
the processing components comprise an embedded controller interfaced with the nickel titanium wire to apply current at the nickel titanium wire in response to a predetermined condition.

4. The information handling system of claim 3 wherein the predetermined condition comprises a first thermal state and the current actuates the nickel titanium wire to extend the foot out of the housing.

5. The information handling system of claim 4 wherein the predetermined condition comprises a second thermal state and the current actuates the nickel titanium wire to release the lock to allow the foot to retract into the housing.

6. The information handling system of claim 5 wherein the lock comprises a push-push switch integrated in each of the first and second ramps and aligned to extend into the first and second sliding ramps.

7. The information handling system of claim 5 wherein the embedded controller accepts an end user command to change a position of the foot and in response applies current to the nickel titanium wire.

8. The information handling system of claim 5 wherein the biasing device comprises first and second leaf springs disposed at opposing sides of the foot.

9. The information handling system of claim 5 wherein:
the housing comprises first and second housing portions coupled by a hinge; and
the foot is disposed in the first housing portion at a bottom surface proximate the hinge.

10. A method for adjusting an information handling system resting height, the method comprising:
initiating an actuator to pull first and second sliding ramps towards each other within a cavity of a foot located at a bottom surface of a housing of the information handling system;
sliding the first and second sliding ramps against first and second ramps formed in the cavity; and
translating vertical movement generated by the sliding from the first and second sliding ramps to the foot with flail first and second sliding brackets slidingly coupling the first and second sliding ramps to the housing.

11. The method of claim 10 further comprising:
aligning a lock to engage the foot at a predetermined vertical position; and
engaging the lock in response to the translating vertical movement when the vertical movement extends the foot a predetermined distance out of the housing.

12. The method of claim 11 further comprising:
biasing the foot into the housing;
releasing the lock in response to a predetermined condition, the biasing moving the foot vertically into the housing.

13. The method of claim 12 wherein initiating an actuator further comprises:
applying current to heat a nickel titanium wire; and
shortening the nickel titanium wire in response to the heat, the nickel titanium wire coupled to the first and second sliding ramps.

14. The method of claim 13 wherein:
the engaging comprises extending a push-push lock to hold the foot; and
the releasing comprises initiating the actuator to retract the push-push lock and bias the foot into the housing.

15. The method of claim 14 wherein the biasing the foot into the housing further comprises coupling a leaf spring to the foot aligned to leverage against the housing to pull the foot into the housing.

16. The method of claim 15 further comprising:
monitoring thermal conditions within the housing with an embedded controller; and
initiating the actuator with the embedded controller based upon the thermal conditions.

17. An information handling system dynamic foot comprising:
a foot having a bottom surface and a cavity, the cavity having first and second ramps at opposing ends;
first and second sliding ramps disposed in the cavity and configured to couple to an information handling system housing; and
an actuator coupled to the first and second sliding ramps, the actuator moving the first and second sliding ramps relative to the first and second ramps to adjust a vertical position of the foot relative to the information handling system housing.

18. The information handling system dynamic foot of claim 17 wherein the actuator comprises nickel titanium wire coupled between the first and second sliding ramps to pull the first and second sliding ramps towards each other when the nickel titanium wire is heated.

19. The information handling system dynamic foot of claim 18 further comprising a lock interfaced with the first and second sliding ramps to hold the first and second sliding ramps in position relative to the first and second ramps at a predetermined vertical position.

20. The information handling system dynamic foot of claim 19 wherein the lock releases in response to shortening of the nickel titanium wire.

\* \* \* \* \*

UNITED STATES PATENT AND TRADEMARK OFFICE
CERTIFICATE OF CORRECTION

| | |
|---|---|
| PATENT NO. | : 11,435,235 B2 |
| APPLICATION NO. | : 16/844143 |
| DATED | : September 6, 2022 |
| INVENTOR(S) | : Allen B. McKittrick et al. |

It is certified that error appears in the above-identified patent and that said Letters Patent is hereby corrected as shown below:

In the Claims

Column 8, Line 3, Claim 10, please delete "flail".

Signed and Sealed this
Thirteenth Day of December, 2022

Katherine Kelly Vidal
*Director of the United States Patent and Trademark Office*